(12) United States Patent
Iijima

(10) Patent No.: US 9,378,804 B2
(45) Date of Patent: Jun. 28, 2016

(54) SEMICONDUCTOR DEVICE

(71) Applicant: RENESAS ELECTRONICS CORPORATION, Tokyo (JP)

(72) Inventor: Masaaki Iijima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/987,534

(22) Filed: Jan. 4, 2016

(65) Prior Publication Data

US 2016/0118103 A1   Apr. 28, 2016

Related U.S. Application Data

(63) Continuation of application No. 14/526,483, filed on Oct. 28, 2014, now Pat. No. 9,263,108.

(30) Foreign Application Priority Data

Nov. 7, 2013   (JP) ................................. 2013-231020

(51) Int. Cl.
   *G11C 7/00*      (2006.01)
   *G11C 11/4076*   (2006.01)
   *G11C 11/4096*   (2006.01)

(52) U.S. Cl.
   CPC ........ *G11C 11/4076* (2013.01); *G11C 11/4096* (2013.01)

(58) Field of Classification Search
   CPC ............... G11C 8/18; G11C 8/16; G11C 8/20
   USPC ..................................... 365/222, 193, 233.13
   See application file for complete search history.

(56) References Cited

U.S. PATENT DOCUMENTS

| 2006/0193188 | A1  | 8/2006  | Smela et al. |
| 2007/0217559 | A1* | 9/2007  | Stott .................... G11C 7/1051 375/355 |
| 2008/0094918 | A1  | 4/2008  | Fujizoe |
| 2011/0292739 | A1  | 12/2011 | Song |

FOREIGN PATENT DOCUMENTS

JP         2008-103013 A    5/2008

OTHER PUBLICATIONS

Notice of Allowance issued in U.S. Appl. No. 14/526,483 dated Oct. 1, 2015.

* cited by examiner

*Primary Examiner* — Han Yang
(74) *Attorney, Agent, or Firm* — McDermott Will & Emery LLP

(57) ABSTRACT

The problem was that the high-impedance state of the difference between signals DQS and DQSB cannot be prevented from being brought in. With this invention, a first comparator circuit outputs a signal DQSIN representing the difference between DQS and DQSB after the coupling of input terminals to a terminal potential and from before the start timing of a preamble of the two signals. A second comparator circuit compares the level of DQS or DQSB with a reference voltage Vref and outputs a signal ODT_DET representing the result of the comparison. A gate circuit masks the signal DQSIN with a signal EW in a masking state. A control circuit identifies the start timing of the preamble based on ODT_DET, and sets the signal EW to the masking state before the start of the preamble and to an unmasking state from the start timing of the preamble.

7 Claims, 9 Drawing Sheets

US 9,378,804 B2

SEMICONDUCTOR DEVICE

CROSS-REFERENCE TO RELATED APPLICATIONS

This application is a Continuation Application of U.S. patent application Ser. No. 14/526,483, filed on Oct. 28, 2014 which in turn claims the benefit of Japanese Patent Application No. 2013-231020 filed on Nov. 7, 2013 including the specification, drawings and abstract is incorporated herein by reference in their entireties.

BACKGROUND

The present invention relates to a semiconductor device. More particularly, the invention relates to a semiconductor device that includes a data strobe signal receiving circuit.

In the related art, there have been known techniques which, upon readout from a DRAM, prevent the high-impedance (intermediate level) state of a data strobe signal output from the DRAM from being brought in.

For example, Japanese Unexamined Patent Publication No. 2008-103013 describes a data strobe receiver in which a memory read control circuit inputs a read request signal related to the reading of data from a memory and a burst length information signal related to a read request. When the read request signal becomes active, the memory read control circuit controls a pull-up circuit to pull up a data strobe signal DQS. Upon detecting the transition of the data strobe signal DQS from the High level to the Low level, the memory read control circuit sets a mask signal to an unmasking state. The memory read control circuit sets the mask signal to a masking state upon determining that the data strobe signal has repeated predetermined transitions on the basis of the burst length information signal. Subsequent to the repeated transitions, a postamble of the data strobe signal DQS is started. At the end of a postamble period, the memory read control circuit pulls up the data strobe signal DQS to the High level.

SUMMARY

However, the data strobe receiver described in the above-cited patent publication merely receives the single data strobe signal DQS and is designed to prevent the high-impedance state of only one data strobe signal from getting brought in.

Meanwhile, there exist data strobe receivers that receive complementary data strobe signals DQS and DQSB. By detecting the difference between the received signals DQS and DQSB, this type of data strobe receiver can reduce the noise superposed on the signals DQS and DQSB. The problem is that the method described in the above-cited patent publication cannot be applied to this data strobe receiver that receives the complementary data strobe signals DQS and DQSB. That is because the data strobe receiver that receives the complementary data strobe signals pulls up the difference therebetween to the high-impedance state, whereas the method of the above-described patent publication is incapable of preventing the high-impedance state thus generated from being brought in.

According to one embodiment of the present invention, there is provided a data strobe receiving circuit including a first and a second comparator circuit. The first comparator circuit outputs the difference between a data strobe signal and an inverted data strobe signal after the coupling of an input terminal to a terminal potential and from before the start of a preamble. The second comparator circuit compares the level of either the data strobe signal or the inverted data strobe signal with a reference voltage and outputs a signal representing the result of the comparison to a control circuit. The data strobe receiving circuit further includes a gate circuit and the control circuit. The gate circuit masks the output signal of the first comparator circuit using a mask signal. The control circuit identifies the start timing of the preamble on the basis of the signal output from the second comparator circuit, sets the mask signal to the masking state before the start of the preamble, and sets the mask signal to the unmasking state from the start timing of the preamble.

Thus according to one embodiment of the present invention outlined above, the high-impedance state of the difference between the signals DQS and DQSB can be prevented from being brought in.

BRIEF DESCRIPTION OF THE DRAWINGS

Further objects and advantages of the present invention will become apparent upon a reading of the following description and appended drawings in which.

DETAILED DESCRIPTION

Some preferred embodiments of the present invention are described below with reference to the accompanying drawings.

First Embodiment

Figure 1:
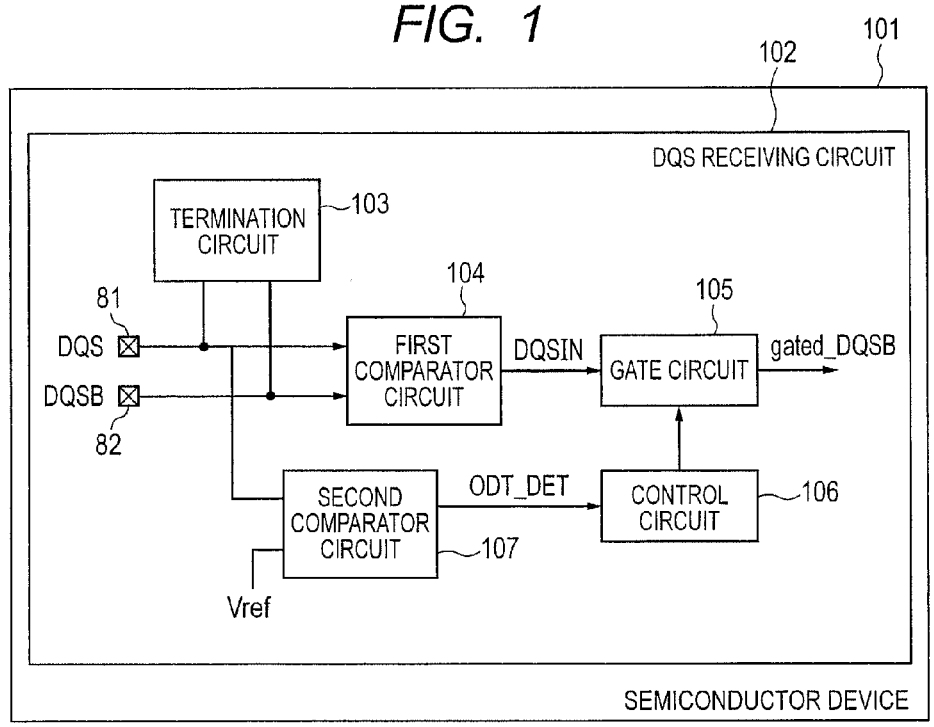
FIG. 1 is a diagram showing a structure of a semiconductor device as a first embodiment of the present invention.

FIG. 1 is a diagram showing a structure of a semiconductor device 101 as the first embodiment of the present invention.

Referring to FIG. 1, the semiconductor device 101 includes a DQS receiving circuit 102. The DQS receiving circuit 102 includes an input terminal 81, an input terminal 82, a termination circuit 103, a first comparator circuit 104, a gate circuit 105, a control circuit 106, and a second comparator circuit 107.

The input terminal 81 receives a data strobe signal DQS output from a memory. The input terminal 82 receives an inverted data strobe signal DQSB output from the memory.

The termination circuit 103 couples the input terminals 81 and 82 to a terminal potential from before the start timing of a DQS/DQSB preamble.

After the input terminals 81 and 82 are coupled to the terminal potential and before the start timing of the DQS/DQSB preamble, the first comparator circuit 104 outputs a DQS input signal DQSIN representing the difference between the data strobe signal DQS and the inverted data strobe signal DQSB.

The second comparator circuit 107 compares the level of either the data strobe signal DQS or the inverted data strobe signal DQSB with a reference voltage Vref, and outputs an ODT (On-Die Termination) state detection signal ODT_DET representing the result of the comparison.

The gate circuit 105 masks the DQS input signal DQSIN output from the first comparator circuit 105 using a DQS mask signal EW in the masking state.

On the basis of the ODT state detection signal ODT_DET output from the second comparator circuit 107, the control circuit 106 identifies the start timing of the DQS/DQSB preamble and controls the level change of the DQS mask signal EW accordingly. Before the start of the DQS/DQSB preamble, the control circuit 106 sets the DQS mask signal EW to the masking state. From the start timing of the DQS/DQSB preamble, the control circuit 106 sets the DQS mask signal EW to the unmasking state.

Figure 2:
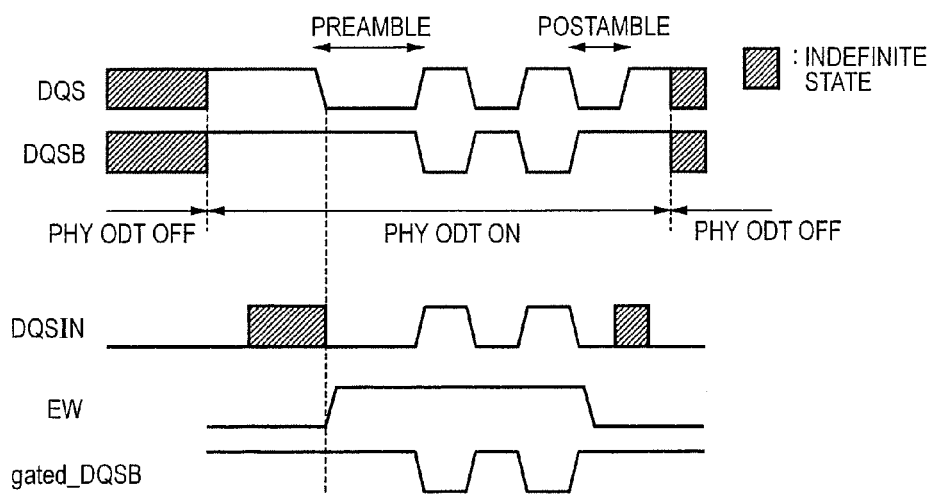
FIG. 2 is a timing chart in effect when data is read from a DDR-SDRAM in the first embodiment.

FIG. 2 is a timing chart in effect when data is read from a DDR-SDRAM 6 in the first embodiment.

The DQS/DQSB preamble is a portion where the complementary data strobe signals DQS and DQSB go Low and High respectively before the signals start to toggle. A DQS/DQSB postamble is a portion where the complementary data strobe signals DQS and DQSB go Low and High respectively after they stop toggling.

Because the termination circuit 103 couples the input terminals 81 and 82 to the terminal potential so that the input terminals 81 and 82 are pulled up, the DQS input signal DQSIN output from the first comparator circuit 104 takes an indefinite value before the start of the DQS/DQSB preamble and at the end of the DQS/DQSB postamble.

Before the start of the DQS/DQSB preamble, the control circuit 106 sets the DQS mask signal EW to a Low-level masking state. This causes the gate circuit 105 to mask the DQS input signal DQSIN of the indefinite value using the DQS mask signal EW (Low level) in the masking state.

At the start timing of the DQS/DQSB preamble, the control circuit 106 sets the DQS mask signal EW to a High-level unmasking state. This allows the gate circuit 105 not to mask the DQS input signal DQSIN using the DQS mask signal EW.

At the end of the DQS/DQSB postamble, the DQS input signal DQSIN output from the first comparator circuit 104 again takes an indefinite value. At the end timing of the DQS/DQSB postamble, the control circuit 106 sets the DQS mask signal EW to the Low-level masking state. This causes the gate circuit 105 to mask the DQS input signal DQSIN of the indefinite value using the DQS mask signal EW (Low level) in the masking state.

According to the first embodiment described above, the data strobe receiver receiving the complementary data strobe signals can be prevented from bringing in the high-impedance state of the difference between the signals DQS and DQSB before the preamble.

Second Embodiment

Figure 3:
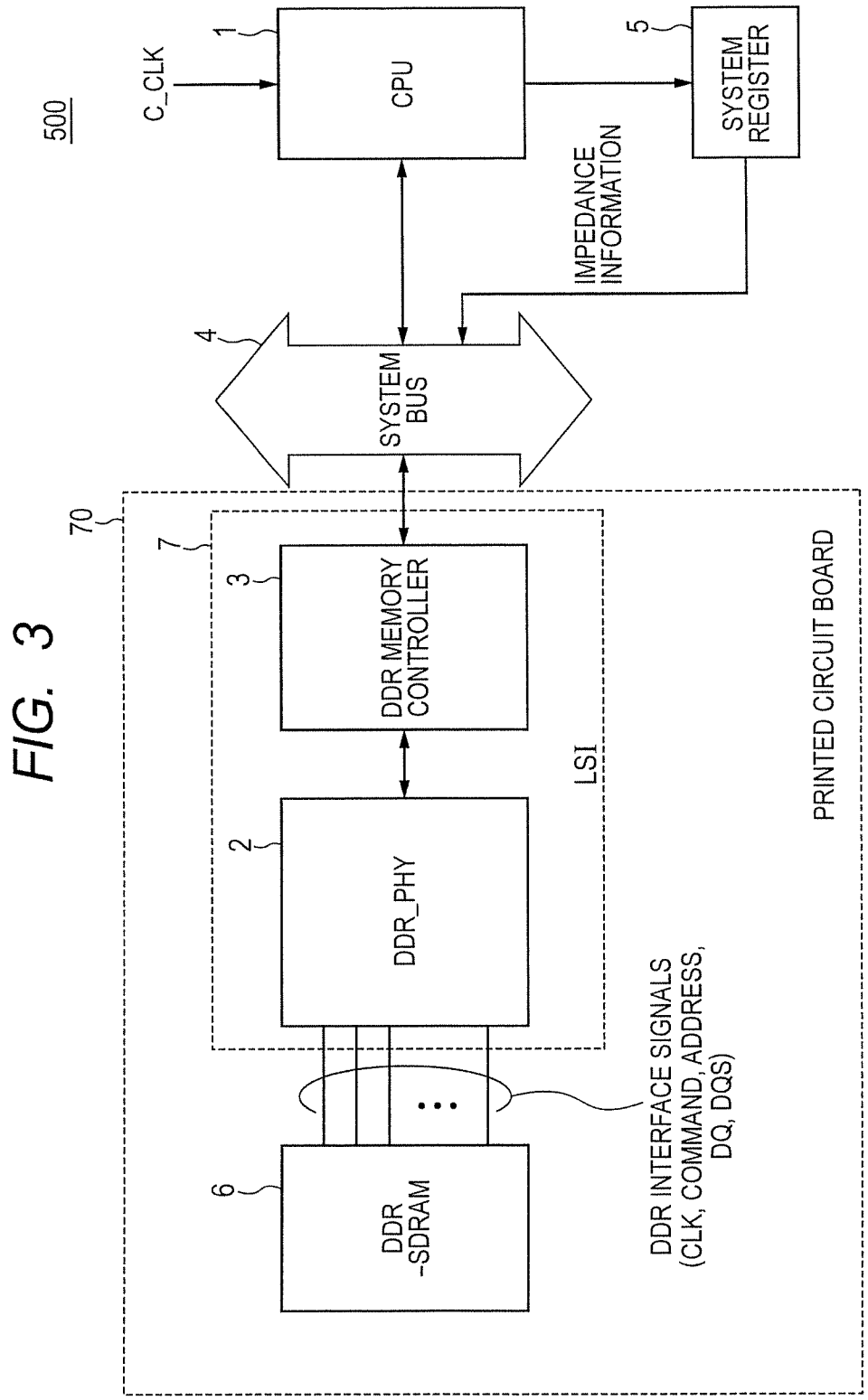
FIG. 3 is a diagram showing a structure of a semiconductor device as a second embodiment of the present invention.

FIG. 3 is a diagram showing a structure of a semiconductor device 500 as the second embodiment of the present invention.

The semiconductor device 500 includes a DDR-SDRAM (Double Data Rate-Synchronous Dynamic Random Access Memory) 6, a DDR-PHY (DDR-PHYsical Interface) 2, a DDR memory controller 3, a system bus 4, a CPU (Central Processing Unit) 1, and a system register 5.

An LSI (large Scale Integration) 7 and the DDR-SDRAM 6 are mounted over a printed circuit board 70. The LSI 7 includes the DDR-PHY 2 and DDR memory controller 3.

There are provided a clock signal CLK, a command signal, an address signal, a data signal DQ, and complementary data strobe signals DQS and DQSB as the interface signals between the DDR-PHY 2 and the DDR-SDRAM 6.

At both a rising and a falling edge of the synchronous clock signal, the DDR-SDRAM 6 outputs data (read) and inputs data (write).

The DDR-PHY 2 converts parallel data coming from the DDR memory controller 3 into serial data and sends the data to the DDR-SDRAM 6. The DDR-PHY 2 also converts serial data coming from the DDR-SDRAM 6 into parallel data and sends the data to the DDR memory controller 3.

The DDR memory controller 3 controls the DDR-SDRAM 6. The system bus 6 is a bus that couples the CPU 1 to the DDR memory controller 3.

The CPU 1 operates on a core clock signal C_CLK. The CPU 1 orders the reading of data from the DDR-SDRAM 6 and the writing of data thereto.

The system register 5 holds impedance information representative of the magnitude of the impedance between the DDR-SDRAM 6 and the DDR-PHY 2.

Figure 4:
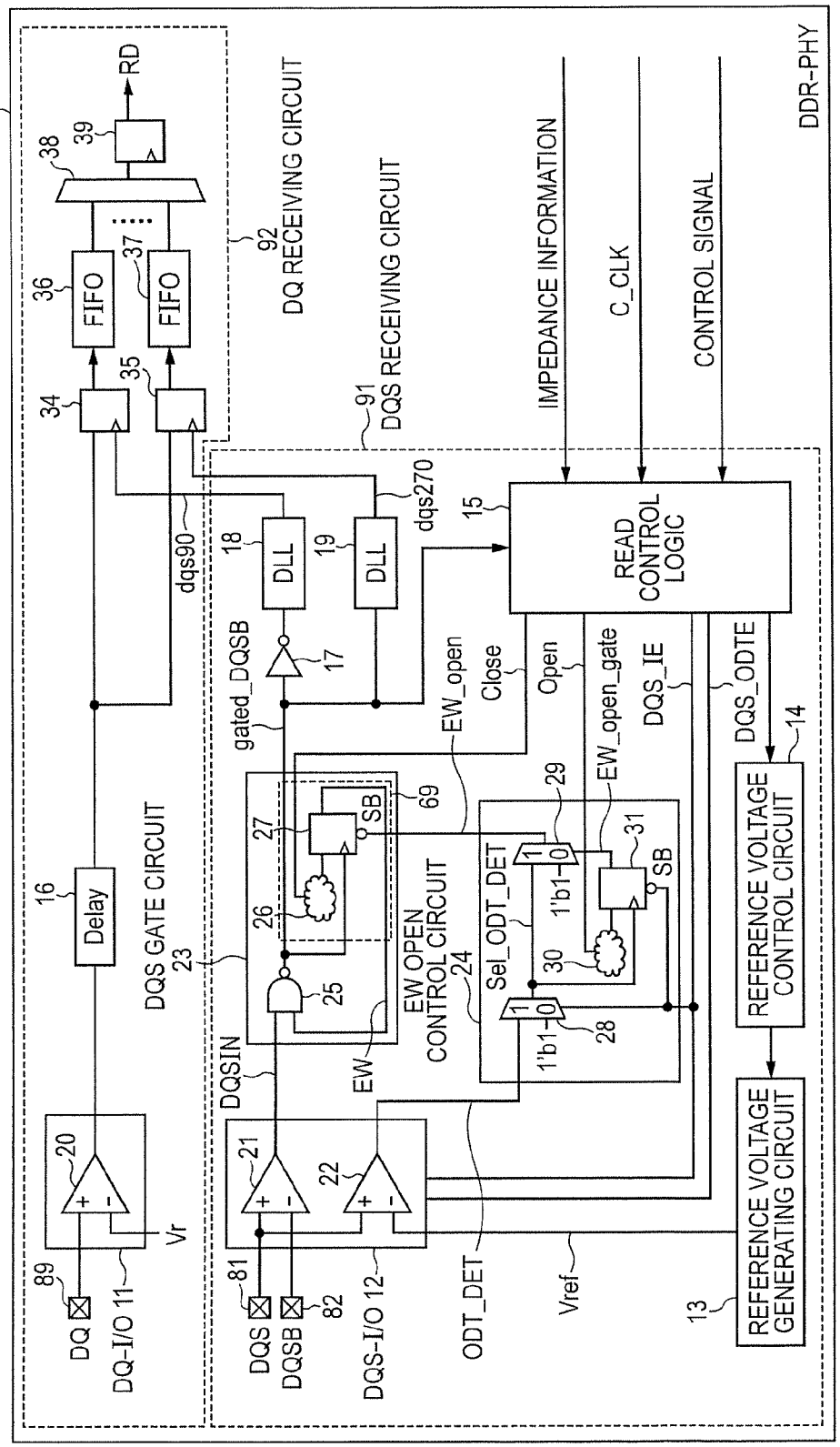
FIG. 4 is a diagram showing a structure of a DDR-PHY in the second embodiment.

FIG. 4 is a diagram showing a structure of the DDR-PHY 2 in the second embodiment. The DDR-PHY 2 includes a DQ receiving circuit 92 and a DQS receiving circuit 91.

The DQ receiving circuit 92 includes a DQ-IO 11, a delay circuit 16, a first rising edge capture flip-flop 34, a first falling edge capture flip-flop 35, a rising edge read FIFO 36, a falling edge read FIFO 37, a selector 38, and a flip-flop 39. The DQS receiving circuit 91 includes an input terminal 81, an input terminal 82, a DQS-IO 12, a DQS gate circuit 23, a read control logic 15, a reference voltage control circuit 14, a reference voltage generating circuit 13, an EW open control circuit 24, an inverter 17, a DLL (Delay-Locked Loop) circuit 18, and a DLL circuit 19.

The DQ-IO 11 includes a differential receiver circuit 20. The differential receiver circuit 20 compares a data signal DQ with a reference voltage Vr.

The delay circuit 16 delays the output of the differential receiver circuit 20. The first rising edge capture flip-flop 34 latches the output from the delay circuit 16 at a rising edge of a first correction data strobe signal dqs90 output from the DLL circuit 18. The first falling edge capture flip-flop 35 latches the output from the delay circuit 16 at a rising edge of a second correction data strobe signal dqs270 output from the DLL circuit 19.

The rising edge read FIFO 36 holds the output of the first rising edge capture flip-flop 34 on a first-in first-out basis. The falling edge read FIFO 37 holds the output of the first falling edge capture flip-flop 35 on a first-in first-out basis.

The selector 38 selects alternatively the output of the rising edge read FIFO 36 or the output of the falling edge read FIFO 37.

The flip-flop 39 forwards the output of the selector 38 as read data RD to the DDR memory controller 3.

The read control logic 15 controls the reading of data from the DDR-SDRAM 6 in accordance with the instruction sent from the CUP 1 to read data from the DDR-SDRAM 6. The read control logic 15 outputs a close signal (masking enable signal) Close to the DQS gate circuit 23 and an open signal (unmasking enable signal) Open to the EW open control circuit 24. The read control logic 15 also outputs an ODT enable signal DQS_ODTE to the DQS-IO 12 and a DQS input enable signal DQS_IE to the DQS-IO 12 and to the EW open control circuit 24. As with the CPU 1, the read control logic 15 operates on the core clock signal C_CLK.

The reference voltage control circuit 14 determines the magnitude of the reference voltage Vref based on the impedance information sent from the system register 5.

The reference voltage generating circuit 13 outputs the reference voltage Vref of which the magnitude has been determined by the reference voltage control circuit 14.

The input terminal 81 receives the data strobe signal DQS output from the DDR-SDRAM 6. The input terminal 82 receives the inverted data strobe signal DQSB output from the DDR-SDRAM 6.

Upon readout from the DDR-SDRAM 6, the DQS-IO 12 outputs a DQS input signal DQSIN and an ODT state detection signal ODT_DET based on the complementary data strobe signals DQS and DQSB output from the DDR-SDRAM 6, on the reference voltage Vref, on the DQS input enable signal DQS_IE, and on the ODT enable signal DQS_ODTE.

Figure 5:
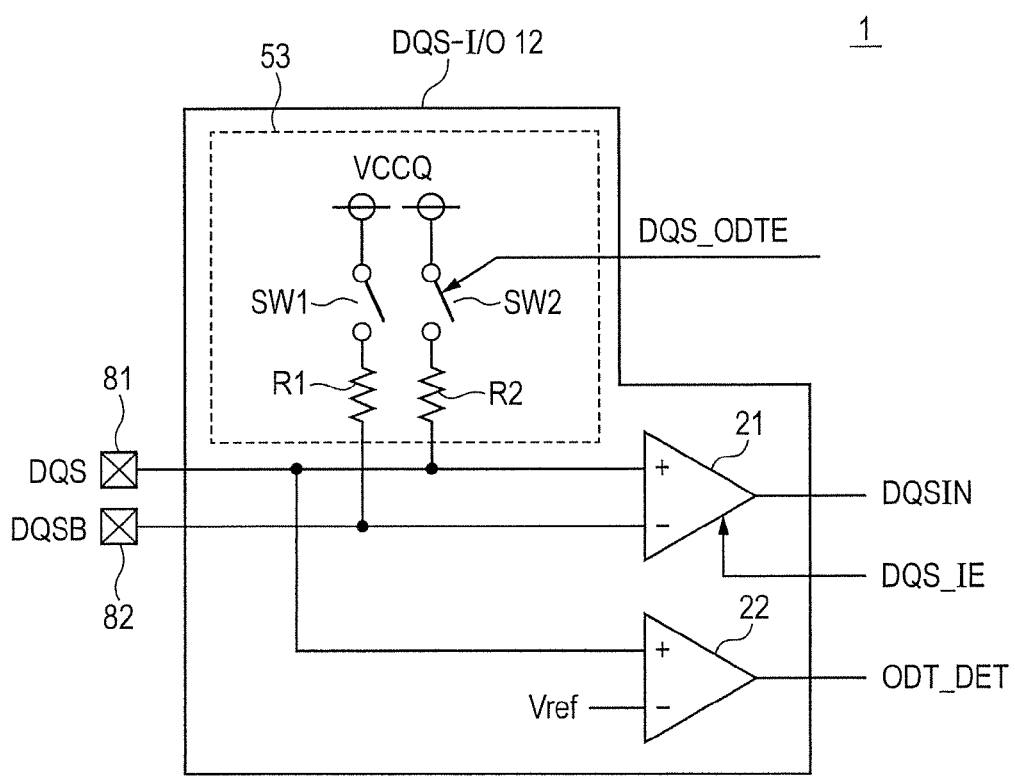
FIG. 5 is a diagram showing a structure of a DQS-IO in the second embodiment.

FIG. 5 is a diagram showing a structure of the DQS-IO 12 in the second embodiment. The DQS-IO 12 includes a differential receiver circuit 21, a single receiver circuit 22, and a termination circuit 53. The termination circuit 53 serves to suppress signal reflection, and includes switches SW1 and SW2 and resistors R1 and R2 to be coupled to a VCCQ terminal bearing a power supply voltage VCCQ (e.g., 1.5 V).

The switch SW1 and the resistor R1 are located interposingly between the VCCQ terminal and the input terminal 82. The switch SW2 and the resistor R2 are located interposingly between the VCCQ terminal and the input terminal 81. The switches SW1 and SW2 are controlled by the ODT enable signal DQSODTE sent from the read control logic 15. When the ODT enable signal DQS_ODTE is activated to the High level during an ODT effective period, the switches SW1 and SW2 are turned on. With the switches SW1 and SW2 turned on, the voltages of the input terminals 81 and 82 are pulled up to the power supply voltage VCCQ.

As a result, even if the DDR-SDRAM 6 drives the data strobe signal DQS to the Low level upon data readout, the VCCQ terminal of the DDR-PHY 2 remains effective so that the data strobe signal DQS does not drop to 0 V. This prevents CMOS logic gates such as AND circuits from detecting the level of the data strobe signal DQS. In the second embodiment, the single receiver circuit 22 is used to compare the data strobe signal DQS with the reference voltage Vref in magnitude so as to detect the level of the data strobe signal DQS.

When the DQS input enable signal DQS_IE is at the High level, the differential receiver circuit 21 generates a DQS input signal DQSIN representing the voltage difference between the input terminals 81 and 82. The differential receiver circuit 21 outputs the Low level when the DQS input enable signal DQS_IE is at the Low level.

The single receiver circuit 22 compares the voltage of the input terminal 81 with the reference voltage Vref to find the difference therebetween, and outputs the ODT state detection signal ODT_DET accordingly.

The DQS gate circuit 23 generates a DQS mask signal EW (Enable Window) based on the DQS input signal DQSIN output from the DQS-IO 12, on the EW open signal (unmasking instruction signal) output from the EW open control circuit 24, and on the close signal (masking enable signal) Close output from the read control logic 15. Given the generated DQS mask signal EW and the DQS input signal DQSIN, the DQS gate circuit 23 outputs a gate DQS signal gated_DQSB as a masked DQS signal.

The DQS gate circuit 23 includes a NAND circuit 25 and a mask signal generating unit 69. The NAND gate 25 outputs the gate DQS signal gated_DQSB as the NAND of the DQS input signal DQSIN and the DQS mask signal EW. The gate DQS signal gated_DQSB turns into the inverted data strobe signal DQS when the DQS mask signal EW is at the High level (unmasking state). The gate DQS signal gated_DQSB is at the High level when the DQS mask signal EW is at the Low level (masking state) regardless of the data strobe signal DQS.

The mask signal generating unit 69 sets the DQS mask signal to the unmasking state on the basis of an activated EW open signal EW_open (unmasking instruction signal) coming from the EW open control circuit 24. The mask signal generating unit 69 further sets the DQS mask signal EW to the masking state based on an activated close signal Close (masking enable signal) coming from the read control logic 15.

The mask signal generating unit 69 includes a control logic 26 and a set bar terminal-equipped fl-type flip-flop 27. The control logic 26 is made up of one or multiple logic circuits and installed as needed.

The set bar terminal SB attached to the D-type flip-flop 27 receives the EW open signal EW_open. The data input terminal of the flip-flop 27 receives the output of the control logic 26 which in turn receives the close signal Close. The clock terminal of the flip-flop 27 receives the gate DQS signal gated_DQSB output from the NAND circuit 25. The output terminal of the flip-flop 27 outputs the DQS mask signal EW.

The EW open control circuit 24 outputs the EW open signal EW_open to activate the DQS mask signal EW based on the ODT state detection signal ODT_DET output from the DQS-IO 12, on the DQS input enable signal DQS_IE output from the read control logic 15, and on the activated open signal Open (unmasking enable signal) output from the read control logic 15.

The EW open control circuit 24 identifies the timing at which the ODT state detection signal ODT_DET from the DQS-IO 12 changes from the High to the Low level for the first time as the start timing of the DQS/DQSB preamble, and sets the EW open signal EW_open to the Low level at the timing thus identified.

The EW open control circuit 24 includes selectors 28 and 29, a set bar terminal-equipped D-type flip-flop 31, and a control logic 30. The control logic 30 is composed of one or multiple logic circuits and is installed as needed.

The selector 28 in the first stage receives the DQS input enable signal DQS_IE from the read control logic 15 as a select signal. The selector 28 receives the ODT state detection signal ODT_DET output from the DQS-IO 12 and a "1" (1'b1) fixed to the High level (i.e., binary one digit). The selector 28 outputs an ODT state detection signal Sel_ODT_DET.

The set bar terminal SB attached to the D-type flip-flop 31 receives the DQS input enable signal DQS_IE. The data input terminal of the flip-flop 31 receives the output of the control logic 30 which in turn receives the open signal Open. The clock terminal of the flip-flop 31 receives the ODT state detection signal Sel_ODT_DET output from the selector 28. The output terminal of the flip-flop 31 outputs a gating signal EW_open_gate.

The selector 29 in the second stage receives as the select signal the gating signal EW_open_gate output from the flip-flop 31. The second-stage selector 29 also receives a "1" fixed to the High level (1'b1) and the ODT state detection signal Sel_ODT_DET output from the selector 28. The selector 29 outputs the EW open signal EW_open.

The inverter 17 inverts the gate DQS signal gated_DQSB. The DLL 18 outputs the first correction data strobe signal dqs90, a signal obtained by having the output of the inverter 17 (i.e., logically inverted gate DQS signal gated_DQSB)

delayed by 90 degrees in phase. The first correction data strobe signal dqs90 is a signal delayed by 90 in phase relative to the data strobe signal DQS.

The DLL 19 outputs the second correction data strobe signal dqs270, a signal obtained by having the gate DQS signal gated_DQSB delayed by 90 degrees in phase. The second correction data strobe signal dqs270 is a signal delayed by 270 degrees in phase relative to the data strobe signal DQS.

(Operation)

Figure 6:
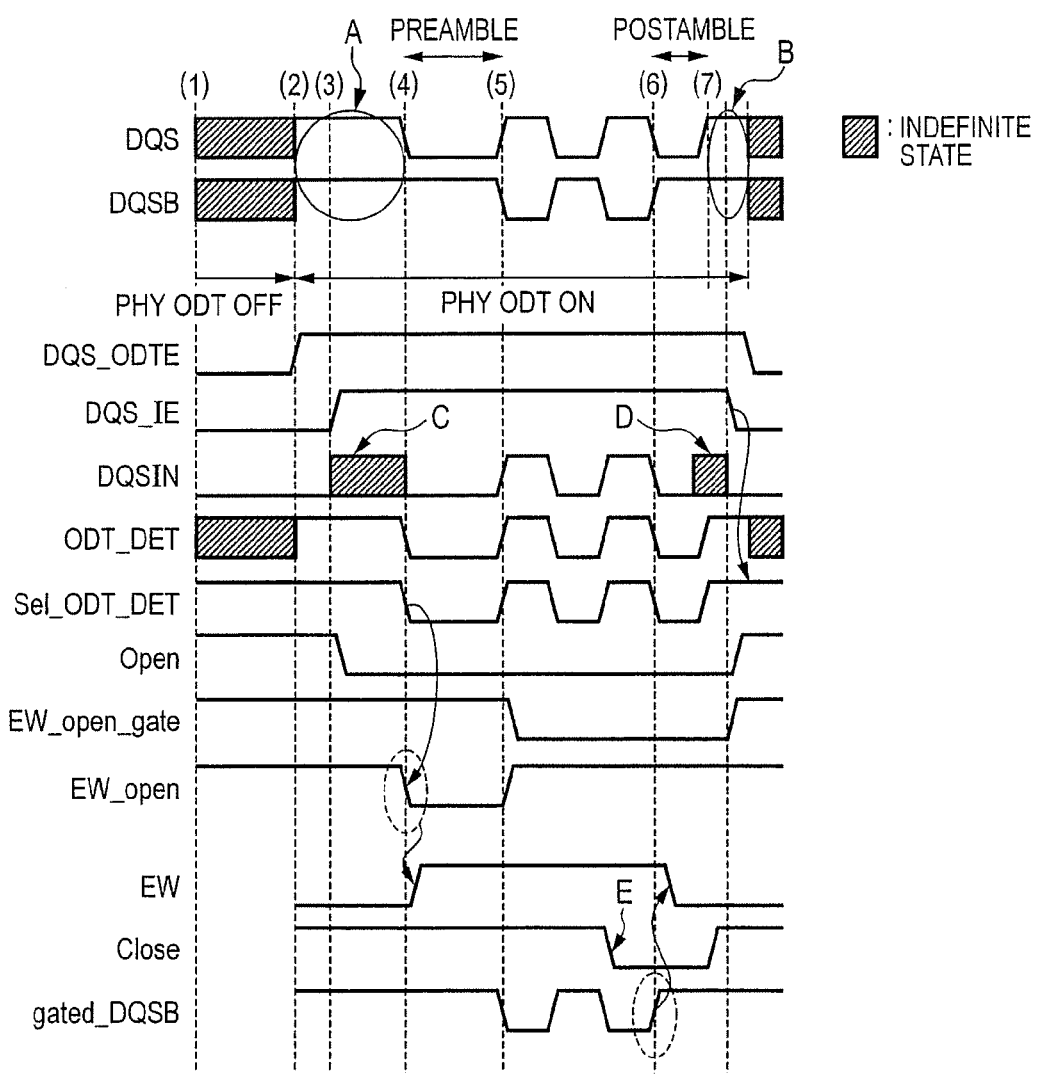
FIG. 6 is a timing chart in effect when data is read from a DDR-SDRAM in the second embodiment.

FIG. 6 is a timing chart in effect when data is read from the DDR-SDRAM 6 in the second embodiment.

First, at the start of readout (1), the levels of the complementary data strobe signals DQS and DQSB output from the DDR-SDRAM 6 are indefinite. The DQS input enable signal DQS_IE and ODT enable signal DQS_ODTE output from the read control logic 15 are at the Low level in the initial state. The Open signal Open (unmasking enable signal) and the close signal Close (masking enable signal) are at the High level in the initial state.

Because the DQS input enable signal DQS_IE is at the Low level, the first-stage selector 28 in the EW open control circuit 24 outputs a fixed value (High level) and puts the flip-flop 31 into the set state. As a result, the ODT state detection signal Sel_ODT_DET, the gating signal EW_open_gate, and the EW open signal EW_open are set to the High level.

Next, before the start of a DQS/DQSB preamble period (2), the read control logic 15 activates the ODT enable signal DQS_ODTE to the High level. This turns on the switches SW1 and SW2 in the termination circuit 53 to pull up the input terminals 81 and 82 so that the input complementary data strobe signals DQS and DQSB are set to the High level each (indicated with (A)). At this point, the DQS input enable signal DQS_IE is at the Low level, so that the DQS input signal DQSIN output from the differential receiver circuit 21 remains unchanged at the Low level. And because the switches SW1 and SW2 in the DQS-IO 12 are turned on, the ODT state detection signal ODT_DET output from the single receiver circuit 22 is changed to the High level. Since the DQS input signal DQSIN is at the Low level, the close signal Close is at the High level, and the EW open signal EW_open is at the High level, the gate DQSB signal gated_DQSB in the DQS gate circuit 23 is set to the High level and the DQS mask signal EW is set to the Low level.

Then at a point in time (3) before the DQS/DQSB preamble period and after the point in time (2), the read control logic 15 activates the DQS input enable signal DQS_IE to the High level. With the DQS input enable signal DQS_IE activated to the High level, the differential receiver circuit 21 executes differential output. Two signals are input to the differential receiver circuit 21: the data strobe signal DQSB coming from the input terminal 81 and pulled up to the High level, and the inverted data strobe signal DQSB coming from the input terminal 82 and pulled up to the High level. The signal input causes the DQS input signal DQSIN output from the differential receiver circuit 21 to become indefinite (indicated with (C)). At this point, the DQS mask signal EW remains at the Low level, so that the NAND circuit 25 in the DQS gate circuit 23 outputs the gate DQSB signal gated_DQSB at the High level even if the DQS input signal DQSIN is indefinite. This allows the indefinite value of the DQS input signal DQSIN to be masked. When the DQS input enable signal DQS_IE is changed to the High level, the first-stage selector 28 in the EW open control circuit 24 outputs the ODT state detection signal ODT_DET (High level) as the ODT state detection signal Sel_ODT_DET (High level). Also at the point in time (3), the read control logic 15 activates the open signal Open to the Lowe level. That is, the unmasking enable signal (Low-level open signal Open) is output.

Next, at the point in time (4), the DQS/DQSB preamble period is started. That is, the DDR-SDRAM 6 drives the complementary data strobe signals DQS/DQSB to the Low and the High levels respectively. This sets the DQS input signal DQSIN output from the differential receiver circuit 21 to the Low level. The ODT state detection signal ODT_DET output from the single receiver circuit 22 is changed to the Low level. With the ODT state detection signal ODT_DET changed to the Low level, the ODT state detection signal Sel_ODT_DET output from the first-stage selector 28 in the EW open control circuit 24 is changed to the Low level because the DQS input enable signal DQS_IE is at the High level. The gating signal EW_open_gate output from the flip-flop 31 in the EW open control circuit 24 remains at the High level, and the EW open signal EW_open output from the second-stage selector 29 is activated to the Low level. That is, the unmasking instruction signal (Low-level EW open signal EW_open) is output. When the EW open signal EW_open is changed to the Low level, the flip-flop 27 in the DQS gate circuit 23 is put into the set state. Because the close signal Close is at the High level, the DQS mask signal output from the flip-flop 27 is changed to the High level. With the DQS mask signal EW at the High level, the NAND circuit 25 in the DQS gate circuit 23 outputs the gate DQSB signal gated_DQSB that is an inverted DQS input signal DQSIN. This causes the DQS input signal DQSIN to be unmasked.

Next, at the point in time (5), the DQS/DQSB preamble period comes to an end and a DQS toggle period is started. That is, the data strobe signal DQS is changed to the High level and the inverted data strobe signal DQSB is changed to the Low level. This causes the DQS input signal DQSIN output from the differential receiver circuit 21 to be changed to the High level. The ODT state detection signal ODT_DET output from the single receiver circuit 22 is also changed to the High level. With the ODT state detection signal ODT_DET changed to the High level, the ODT state detection signal Sel_ODT_DET is changed to the High level. Because the open signal Open is set to the Low level, the gating signal EW_open_gate output from the flip-flop 31 is changed to the Low level. As a result, the second-stage selector 29 selects the fixed High level, so that the EW open signal EW_open is changed to the High level. When the EW open signal EW_open is changed to the High level, the set state of the flip-flop 27 in the DQS gate circuit 23 is cancelled.

The read control logic 15 controls the number of data signals DQ output from the DDR-SDRAM 6 in response to a read request. That is, the read control logic 15 controls the level of the close signal Close based on the burst length. Specifically, when detecting a (burst length–1)th rising edge of the gate DQS signal gated_DQSB upon receipt of a read instruction, the read control logic 15 activates the close signal Close to the Low level (indicated with E). Thus the masking enable signal is output. The Low-level close signal Close (masking enable signal) is sent to the control logic 26 in the DQS gate circuit 23.

Then at the point in time (6), a DQS postamble period is started. The DDR-SDRAM 6 drives the complementary data strobe signals DQS and DQSB to the Low and the High levels respectively. When the gate DQS signal gated_DQSB goes High, the close signal Close is set to the Low level, which causes the DQS mask signal EW output from the flip-flop 27 in the DQS gate circuit 23 to be changed to the Low level.

Then at the point in time (7), the DQS/DQSB postamble period comes to an end. At this point, the termination circuit 53 pulls up the input terminals 81 and 82, causing the input complementary data strobe signals DQS and DQSB to be brought to the High level each (indicated with (B)). Two signals are input to the differential receiver circuit 21: the data strobe signal DQS coming from the input terminal 81 and pulled up to the High level, and the inverted data strobe signal DQSB coming from the input terminal 82 and pulled up to the High level. The signal input causes the DQS input signal DQSIN output from the differential receiver circuit 21 to become indefinite (indicated with (D)). At this point, the DQS mask signal EW is set to the Low level, so that the NAND circuit 25 in the DQS gate circuit 23 outputs the gate DQSB signal gated_DQSB at the High level even if the DQS input signal DQSIN is indefinite. This causes the indefinite value of the DQS input signal DQSIN to be masked.

The series of operations explained above can mask the indefinite value of the DQS input signal DQSIN generated before the DQS/DQSB preamble and after the DQS/DQSB postamble.

(Reference)

According to the second embodiment, the ODT enable signal DQS_ODTE is activated to the High level before the DQS/DQSB preamble is started. This causes the input terminals 81 and 82 to be pulled up to set the input complementary data strobe signals DQS and DQSB to the High level each. As a result, during the DQS/DQSB preamble period, noise is prevented from being mixed into the data strobe signal DQS under the influence of reflection.

Figure 7:
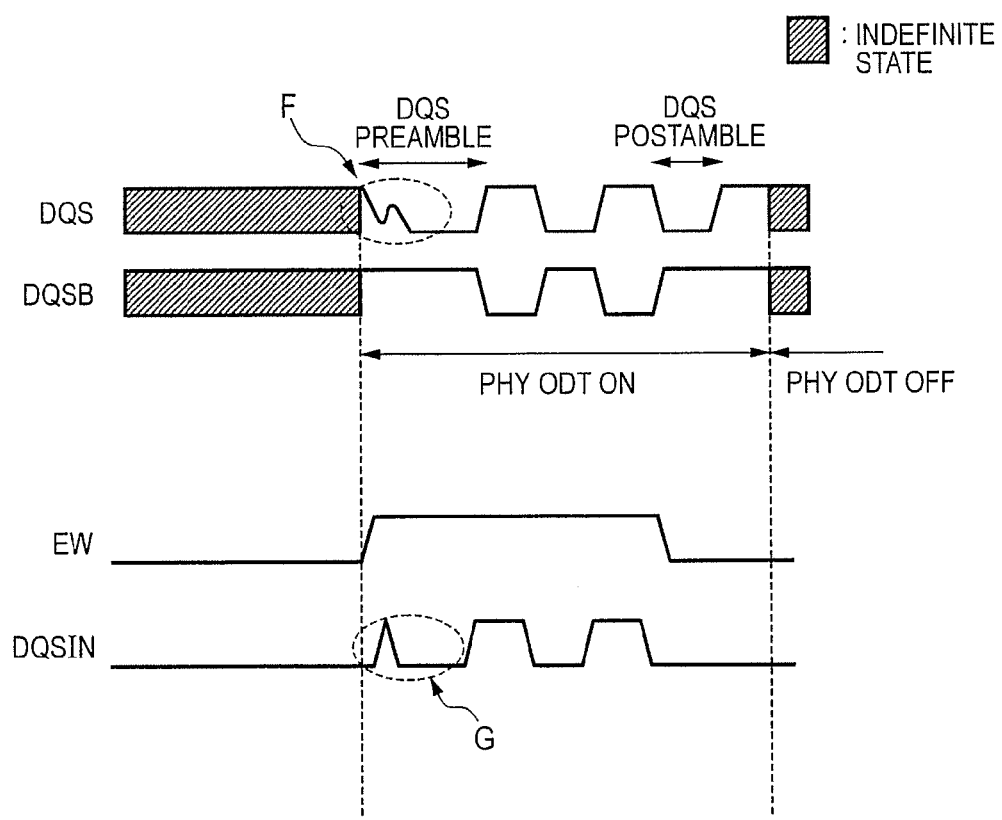
FIG. 7 is a diagram explaining how, after the start of a DQS/DQSB preamble, an ODT enable signal DQS_ODTE is activated to the High level.

On the other hand, as shown in FIG. 7, if the ODT enable signal DQS_ODTE is activated to the High level after the DQS/DQSB preamble is started, noise can be mixed into the data strobe signal DQS under the influence of reflection until the switches SW1 and SW2 are completely turned on. If noise is mixed into the data strobe signal DQS, a glitch G can be generated in the DQS input signal DQSIN output from the differential receiver circuit 21. Because the DQS mask signal EW is set to the High level at the timing of the DQS/DQSB preamble, a glitch can be mixed into the gate DQS signal gated_DQSB.

Third Embodiment

Figure 8:
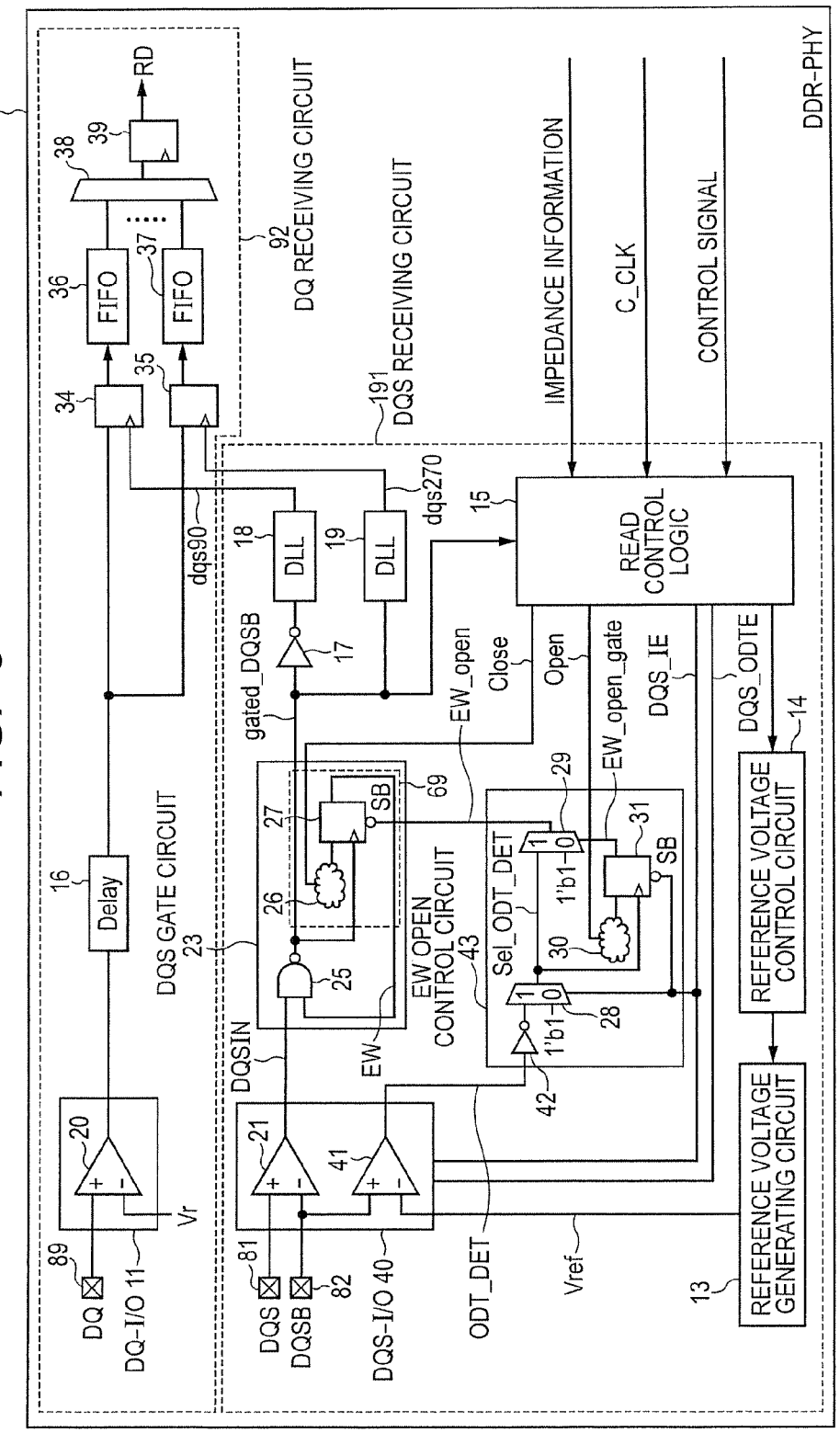
FIG. 8 is a diagram showing a structure of a DDR-PHY in a third embodiment of the present invention.

FIG. 8 is a diagram showing a structure of the DDR-PHY 302 in the third embodiment of the present invention.

The DDR-PHY 302 of FIG. 8 differs from the DDR-PHY 2 of FIG. 4 differs in the following: the DDR-PHY 302 of FIG. 8 is equipped with a DQS-IO 40 replacing the DQS-IO 12 in FIG. 4.

Also, an EW open control circuit 43 in FIG. 8 includes an inverter 42 that is not included in the EW open control circuit 24 in FIG. 4.

Figure 9:
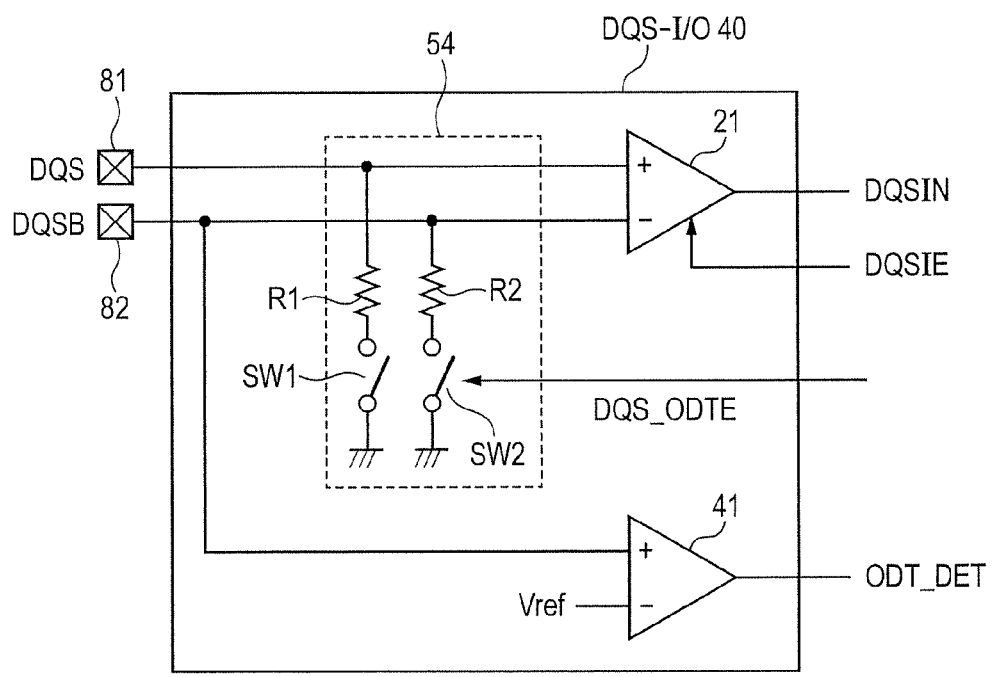
FIG. 9 is a diagram showing a structure of a DQS-IO in the third embodiment.

FIG. 9 is a diagram showing a structure of the DQS-IO 40 in the third embodiment. The DQS-IO 40 includes a differential receiver circuit 21, a single receiver circuit 41, and a termination circuit 54. The termination circuit 54 serves to suppress signal reflection and includes switches SW1 and SW2 and resistors R1 and R2 which are grounded.

The switch SW1 and resistor R1 are positioned interposingly between the ground and the input terminal 81. The switch SW2 and resistor R2 are positioned interposingly between the ground and the input terminal 82. The switches SW1 and SW2 are controlled with the ODT enable signal DQS_ODTE sent from the read control logic 15. When the ODT enable signal DQS_ODTE is activated to the High level, the switches SW1 and SW2 are turned on. With the switches SW1 and SW2 turned on, the voltages of the input terminals 81 and 82 are pulled down to the ground.

The differential receiver circuit 21 is the same as its counterpart included in the DQS-IO 12 of FIG. 5 and thus will not be discussed further.

The single receiver circuit 41 compares the voltage of the input terminal 82 with the reference voltage Vref to find the difference therebetween, and outputs the ODT state detection signal ODT_DET accordingly.

Figure 10:
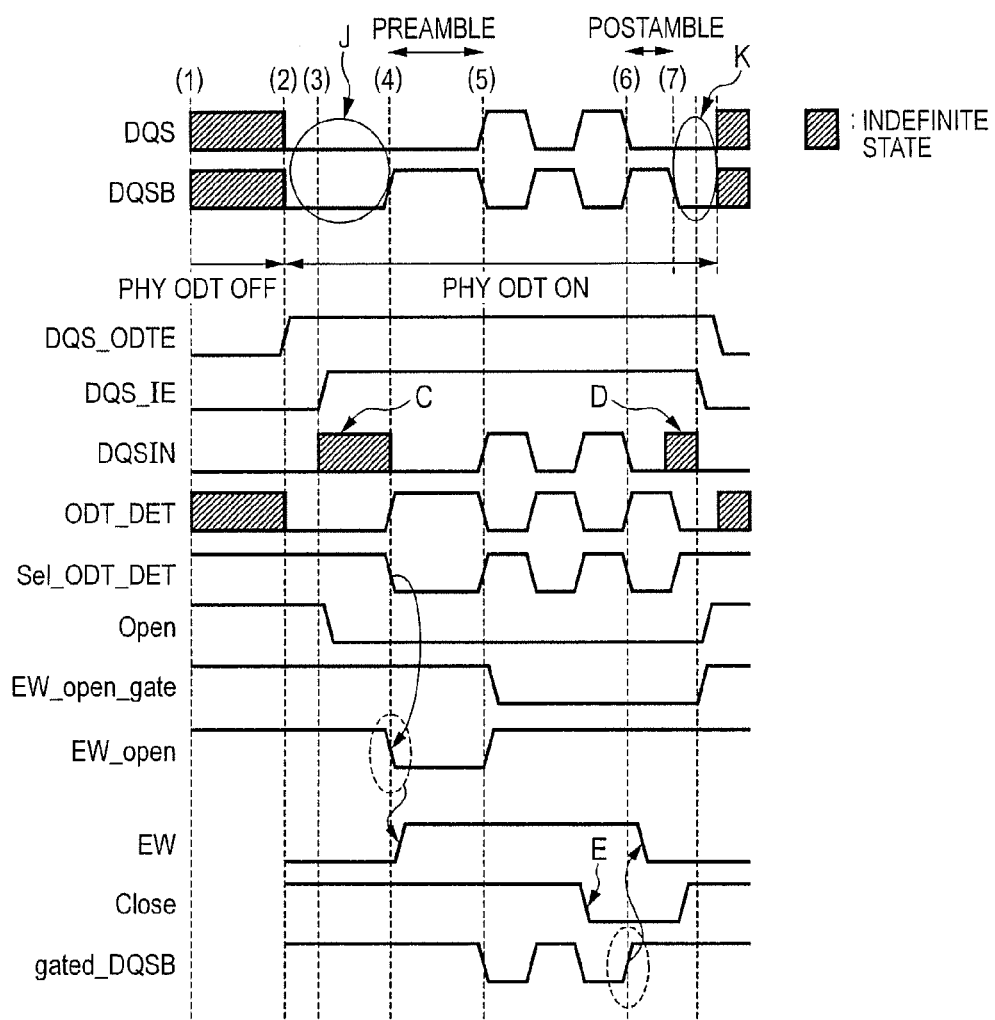
FIG. 10 is a timing chart in effect when data is read from a DDR-SDRAM in the third embodiment.

FIG. 10 is a timing chart in effect when data is read from the DDR-SDRAM 6 in the third embodiment.

The timing chart of FIG. 10 differs from that of FIG. 6 differs in the following: at the point in time (2), the read control logic 15 activates the ODT enable signal DQS_ODTE to the High level. This causes the switches SW1 and SW2 in the termination circuit 54 to be turned on.

When the switches SW1 and SW2 are turned on in the second embodiment, the input terminals 81 and 82 are pulled up. In the third embodiment, by contrast, with the switches SW1 and SW2 turned on, the input terminals 81 and 82 are pulled down, and the input complementary data strobe signals DQS and DQSB are set to the Low level each (indicated with (J)).

Also, when the switches SW1 and SW2 are turned on in the second embodiment, the ODT state detection signal ODT_DET output from the single receiver circuit 22 is changed to the High level. In the third embodiment, by contrast, with the switches SW1 and SW2 turned on, the ODT state detection signal ODT_DET output from the single receiver circuit 41 is changed to the Low level.

The single receiver circuit 22 in the second embodiment compares the reference voltage Vref with the input terminal 81 to which the data strobe signal DQS is input. By contrast, the signal receiver circuit 41 in the third embodiment compares the reference voltage Vref with the input terminal 82 to which the inverted data strobe signal DQSB is input. Thus the ODT state detection signal ODT_DET of the third embodiment and the ODT state detection signal ODT_DET of the second embodiment are in reverse phase to each other.

However, in the third embodiment, the EW open control circuit 43 has the inverter 42 located upstream of the selector 28. This structure allows the ODT state detection signal Sel_ODT_DET generated by the EW open control circuit 43 to perform the same level transition as the ODT state detection signal Sel_ODT_DET of the second embodiment.

As a result, the level transitions of the other signals generated on the basis of the ODT state detection signal Sel_ODT_DET become the same as in the second embodiment.

At the point in time (7), the DQS/DQSB postamble period comes to an end. At this point, the termination circuit 54 pulls down the input terminals 81 and 82, causing the input complementary data strobe signals DQS and DQSB to be brought to the Low level each (indicated with (K)).

According to the third embodiment described above, even when the termination circuit pulls down the input terminals, the indefinite value of the DQS input signal DQSIN generated before the DQS/DQSB preamble and after the DQS/DQSB postamble can be masked in the same manner as in the second embodiment.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A semiconductor device, comprising:
a data receiving circuit coupled to a data input terminal receiving the data signal from a memory, and
a data strobe receiving circuit coupled to a first and a second input terminal receiving the data strobe signal and the inverted data strobe signal from the memory, respectively, the data strobe receiving circuit including:
a termination circuit which couples the first and the second input terminal to a terminal potential based on a termination enable signal;
a first comparator circuit which outputs the difference between the data strobe signal and the inverted data strobe signal;
a second comparator circuit which compares the level of one of the data strobe signal and the inverted data strobe signal;
a gate circuit which masks the output signal of the first comparator circuit with a mask signal; and
a control circuit which identifies the start timing of the preamble of the data strobe signal and the inverted data strobe signal based on the output signal of the second comparator circuit, and sets the mask signal that instructs a masking state of the output signal of the first comparator circuit until the start of the preamble,
wherein the control circuit sets the mask signal that instruct a unmasking state of the output signal of the first comparator after the start of the preamble, and
wherein the data receiving circuit outputs the data signal as a read data from the memory based on an output signal of the gate circuit while the mask signal indicates the unmasking state.

2. The semiconductor device according to claim 1, wherein the data receiving circuit includes:
a data receiver receiving the data signal;
a first and a second capture unit receiving an output signal of the data receiver, respectively, and the output signal of the data receiver is latched in the first capture unit according to the output signal of the gate circuit, and the output signal of the data receiver is latched in the second capture unit according to an inverted signal of the output signal of the gate circuit, and
a selector selecting alternatively the output signal of the first and the second capture unit and the output signal of the first and the second capture unit output as the read data from the memory.

3. The semiconductor device according to claim 1, wherein the control circuit sets the mask signal to the masking state after the end timing of the postamble of the data strobe signal and the inverted data strobe signal.

4. The semiconductor device according to claim 3, further comprising:
a read control logic which outputs a masking enable signal to the gate circuit before the start timing of the postamble;
wherein the control circuit outputs the mask signal that indicates the unmasking state to the gate circuit at the start timing of the preamble; and
wherein the gate circuit includes a logic circuit which performs a logical operation between the output signal of the first comparator circuit and the mask signal, and
a mask signal generating circuit which sets the mask signal to the unmasking state from the start timing of the preamble based on the unmasking instruction signal, and sets the mask signal to the masking state after the end timing of the postamble based on the masking enable signal.

5. The semiconductor device according to claim 1, wherein the control circuit identifies the timing of a first change in the level of the signal output from the second comparator circuit as the start timing of the preamble.

6. The semiconductor device according to claim 1, wherein the second comparator circuit compares the level of the data strobe signal with the reference voltage, and
wherein the terminal potential is a power supply voltage.

7. The semiconductor device according to claim 1, wherein the second comparator circuit compares the level of the inverted data strobe signal with the reference voltage, and
wherein the terminal potential is a ground potential.

* * * * *